United States Patent
El Bacha et al.

(10) Patent No.: US 7,710,152 B1
(45) Date of Patent: May 4, 2010

(54) MULTISTAGE DUAL LOGIC LEVEL VOLTAGE TRANSLATOR

(75) Inventors: Georges El Bacha, Boston, MA (US); Stuart Patterson, East Walpole, MA (US); Daniel Boyko, Norwood, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/825,541

(22) Filed: Jul. 6, 2007

Related U.S. Application Data

(60) Provisional application No. 60/819,316, filed on Jul. 7, 2006.

(51) Int. Cl.
*H03K 19/0175* (2006.01)
(52) U.S. Cl. .............................. 326/81; 326/68; 326/83
(58) Field of Classification Search .................... 326/62, 326/63, 68, 80, 83, 86, 87; 327/333
See application file for complete search history.

(56) References Cited

U.S. PATENT DOCUMENTS

| | | | |
|---|---|---|---|
| 5,559,464 A * | 9/1996 | Orii et al. .................... 327/333 |
| 6,275,112 B1 | 8/2001 | Muza | |
| 6,282,146 B1 * | 8/2001 | Guo et al. .............. 365/230.06 |
| 6,608,905 B1 | 8/2003 | Muza et al. | |
| 7,068,091 B1 * | 6/2006 | Kwong ....................... 327/333 |
| 2004/0090259 A1 * | 5/2004 | Randazzo et al. ........... 327/333 |
| 2004/0150454 A1 | 8/2004 | Bhattacharya et al. | |
| 2006/0125521 A1 | 6/2006 | Kim | |
| 2008/0094111 A1 * | 4/2008 | Nakamori et al. ........... 327/108 |
| 2008/0204109 A1 * | 8/2008 | Pilling et al. ................ 327/333 |

* cited by examiner

*Primary Examiner*—Vibol Tan
*Assistant Examiner*—Jany Tran
(74) *Attorney, Agent, or Firm*—Goodwin Procter LLP

(57) ABSTRACT

A multistage dual logic level voltage translator for translating both high and low input logic levels to higher levels, at least one of which levels is above the maximum recommended voltage of transistors implementing the stages, includes an input stage for receiving input logic levels and an output stage including a high voltage converter having at least a pair of cross-coupled converter transistors responsive to the input stage and including a pair of clamping circuit connected one across each of the converter transistors, for providing the shifted low and high output logic levels.

27 Claims, 4 Drawing Sheets

MULTISTAGE DUAL LOGIC LEVEL VOLTAGE TRANSLATOR

RELATED APPLICATIONS

This application claims benefit of and priority to U.S. Provisional Application Ser. No. 60/819,316 filed Jul. 7, 2006 incorporated herein by this reference.

FIELD OF THE INVENTION

This invention relates to a multistage dual logic level voltage translator for translating between two voltages at least one of which is above the maximum recommended voltage of transistors implementing the stages.

BACKGROUND OF THE INVENTION

Traditionally, when two or more power supplies exist in a system (where one supply is higher than the other) voltage translators, also referred to as level shifters, are used to convert signals from one voltage domain to the other. Most integrated circuit technologies offer at least two types of transistors: low voltage transistors (TL) that are usually used in the core of the chip and high voltage transistors (TH) that are usually used in the peripherals of the chip. Both TL and TH have maximum recommended voltages that should not be exceeded to prevent long term reliability problems with the transistors. Maximum recommended voltage refers to a specific voltage across any two terminals of a device that should not be exceeded. For example, in most 0.18 μm CMOS processes, TLs have a maximum recommended voltage of 1.98V while THs have a maximum recommended voltage of 3.63V. Thus in 3.3 volt systems THs would be safe but TLs at risk, whereas in a 5 volt system both THs and TLs are at risk. Prior art low to high voltage translators have used a combination of THs and TLs to properly convert signals. Protection techniques like cascoding transistors and biasing them at a specific reference voltage have been used to prevent TLs from being exposed to voltages higher than their maximum recommended voltage. There are a number of problems with prior art. There is a need for a voltage translator or shifter that uses at least one power supply that exceeds the maximum recommended voltage of the high voltage transistors (TH). For example if the low supply, VL, equals 3.3V and the high supply, VH, equals 5V even the THs with a maximum recommend voltage of 3.63V are vulnerable. Another shortcoming is that conventional low to high voltage translators will shift in=VL to out=VH but in=0 remains out=0. But there is a need to shift both logic levels (in=VL and in=0) which has not been addressed, as follows: if in=VL, out=VH; if in=0, out=Vx; where 0<Vx<VH. Further, in large systems it's difficult to guarantee the sequence in which power supplies turn on and off. If the low power supply is off (VL=0 volts), while the high one is on (VH=5 volts), both differential inputs of the voltage translator will be floating or equal to 0 volts. As a result the output will be unpredictable. Depending on factors like temperature, leakage current, process corner and previous state of operation, the output might float to the supply, to ground or to an undetermined value potentially exposing one or more devices to voltages exceeding the maximum recommended voltage. Having a deterministic output value regardless of power supply sequencing would protect all devices and could simplify system level design.

BRIEF SUMMARY OF THE INVENTION

It is therefore an object of this invention to provide an improved multistage dual logic level voltage translator for translating between two voltages at least one of which is above the maximum recommended voltage of transistors implementing the stages.

It is a further object of this invention to provide such an improved multistage dual logic level voltage translator which develops a deterministic output value regardless of power supply sequencing to protect all devices from exceeding maximum recommended voltage.

It is a further object of this invention to provide such an improved multistage dual logic level voltage translator which shifts both the higher and lower voltage input levels to higher output levels.

It is a further object of this invention to provide such an improved multistage dual logic level voltage translator which operates over a wide range of power supply voltages.

The invention results from the realization that an improved multistage dual logic level voltage translator for translating both high and low input logic levels to higher levels, at least one of which levels is above the maximum recommended voltage of transistors, implementing the stages can be achieved with an input stage for receiving input logic levels and an output stage including a high voltage converter having at least a pair of cross-coupled converter transistors responsive to the input stage and including a pair of clamping circuits connected one across each of the converter transistors, for providing the shifted low and high output logic levels.

The subject invention, however, in other embodiments, need not achieve all these objectives and the claims hereof should not be limited to structures or methods capable of achieving these objectives.

This invention features a multistage dual logic level voltage translator for translating both high and low input logic levels to higher levels at least one of which levels is above the maximum recommended voltage of transistors implementing the stages. There is an input stage for receiving input logic levels and an output stage including a high voltage converter and a pair of clamping circuits. The high voltage converter includes at least a pair of cross-coupled converter transistors responsive to the input stage and the clamping circuits are connected one across each of the converter transistors, for providing the shifted low and high output logic levels.

In a preferred embodiment the converter transistors may be PMOS transistors. The clamping circuits may each include at least one diode connected PMOS transistor. The output stage may have a high voltage, VH, power supply terminal and the input stage may have a low voltage, VL, power supply terminal. There may be a low voltage power supply absence detector circuit for sensing an absence of input logic levels and enabling determinate output voltage from the high voltage, VH, minus the clamp voltage. The input stage may include an inverter for generating a differential signal from the input logic levels and the low voltage, VL, power supply terminal may be on the inverter. The input stage may include a pair of input transistors. The input transistors may be NMOS transistors. The input stage may include a current limiting circuit in series with each input transistor for limiting the current from the clamping circuits. Each current limiting circuit may include a diode connected NMOS transistor. There may be a voltage limiter circuit interconnecting the input and output stages for protecting the input stage from voltages in excess of the maximum recommended voltage. The voltage limiter circuit may include a pair of native NMOS transistors. The voltage limiter circuit may include a bias network responsive to the high voltage, VH, power supply terminal for varying the bias on the native NMOS transistors.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
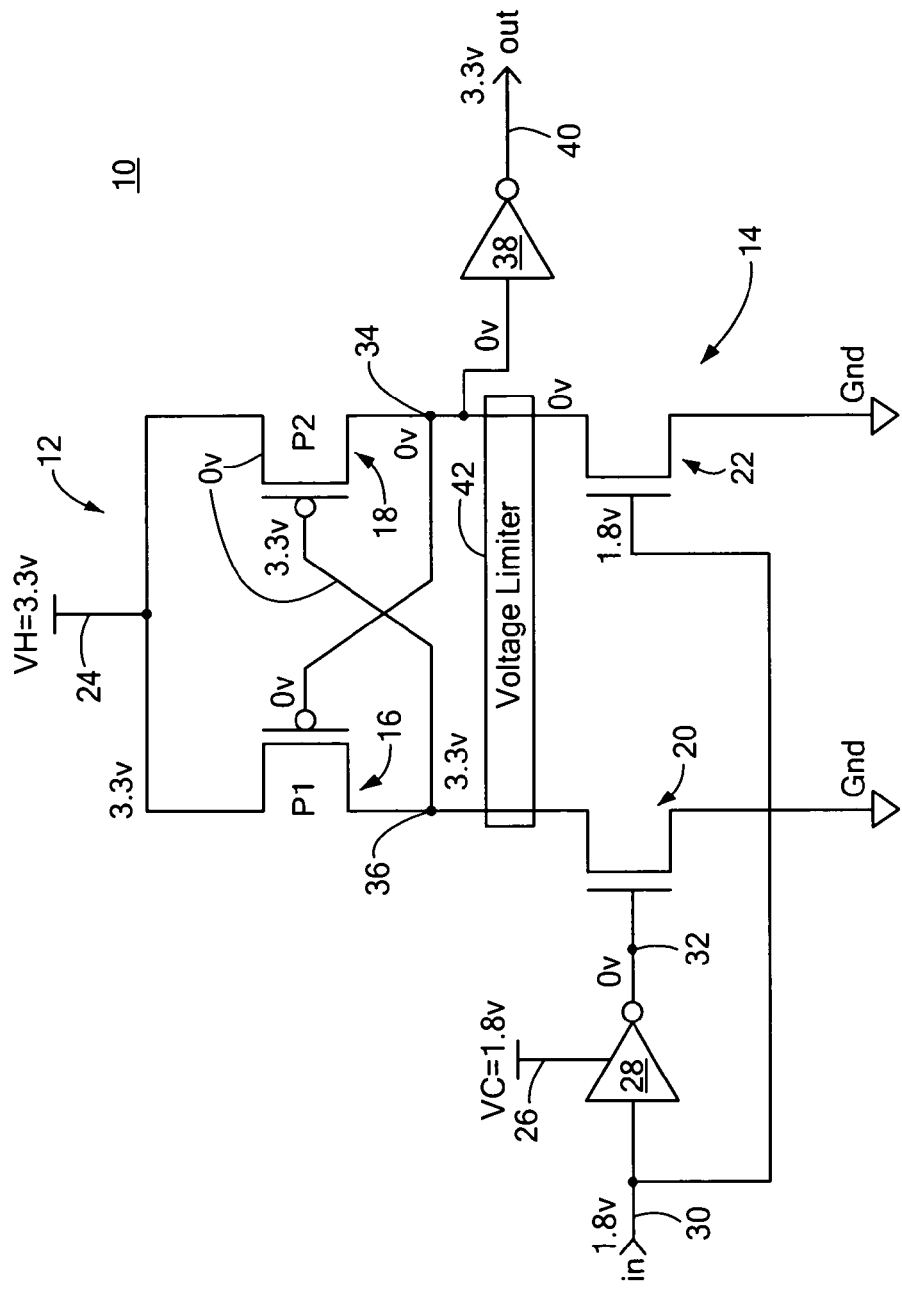
FIG. 1 is a schematic diagram of a prior art level shifter with a high voltage VH below at least some of the transistors' maximum recommended voltages.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior art level shifter including a high voltage converter stage 12 and an input stage 14. High voltage converter stage 12 includes a pair of cross-coupled PMOS transistors 16 and 18. Input stage 14 includes a pair of differential NMOS transistors 20 and 22. High voltage terminal 24 is connected to a high voltage power supply VH which may for example be 3.3 volts. Terminal 26 at inverter 28 is connected to the core voltage power supply VC, typically 1.8 volts in 0.18 µm CMOS.

In operation, assuming the logic signal at input 30 is 1.8 volts, the input at 32 at the gate of NMOS transistor 20 after passing through inverter 28 will be zero volts. The 1.8 volts at input 30 is also provided to the gate of NMOS transistor 22 so the complementary transistors 20 and 22 receive differential signals. With zero volts at input 32 to the gate of NMOS transistor 20, NMOS transistor 20 will be off and NMOS transistor 22 with 1.8 volts at its gate will be on. With transistor 22 on, node 34 will be at ground. With ground at node 34, ground is also applied to the gate of PMOS transistor 16 which turns it on. With PMOS transistor 16 on, the voltage at node 36 will be VH or 3.3 volts since NMOS transistor 20 is off. With 3.3 volts at node 36 there is also 3.3 volts at the gate of PMOS transistor 18 so it will be off. With the zero or ground at node 34 inverter 38 provides the inverse or 3.3 volts on output 40. Thus the 1.8 volts input at 30 has become a 3.3 volt output at 40; if the input at 30 was a zero, the reverse conditions would occur and the output at 40 would be a zero. If all of the transistors 16, 18, 20 and 22 are 0.18 µm CMOS process TH transistors having a 3.63 maximum recommended voltage, then it can be seen that no junction of any of the transistors is at risk since none of them has exceeded 3.3 volts. Note that in this prior art while the 1.8 volts input is level shifted to 3.3 volt output, a zero volt input still delivers a zero volt output: there is no shifting of the lower zero level. If the input transistors 20 and 22 are in fact TL type transistors having a maximum recommended voltage of 1.98 volts then a prior art voltage limiting circuit 42 would need to be provided to protect them as they are exposed to voltages exceeding their maximum recommended voltages.

Figure 2:
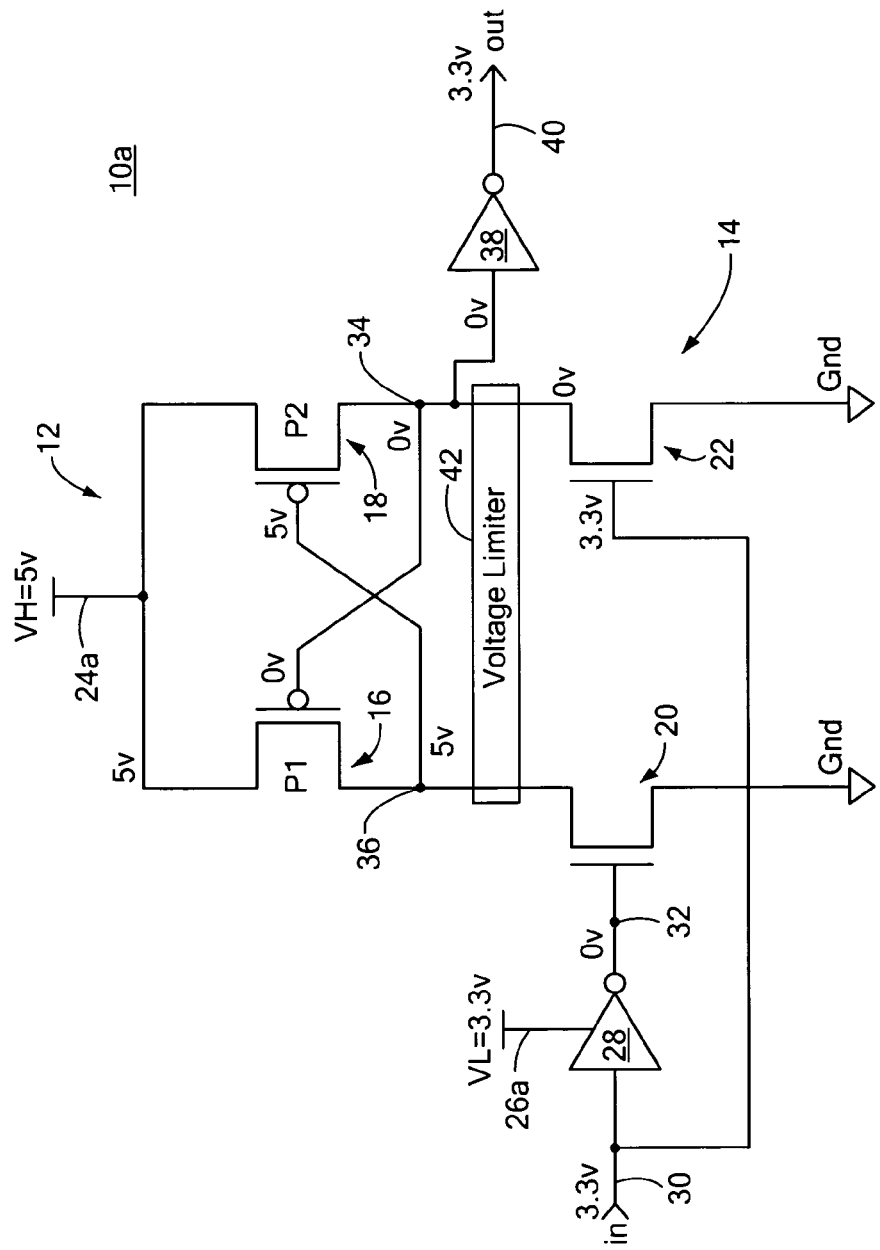
FIG. 2 is a schematic diagram of a prior art level shifter of FIG. 1, with a high voltage VH above all of the transistors' maximum recommended voltage.

An attempt to use the voltage shifter 10 of FIG. 1 to shift higher voltages fails as illustrated with respect to voltage shifter 10a, FIG. 2, where the low voltage power supply terminal 26a is connected to VL which may be for example 3.3 volts and the high voltage power supply terminal 24a is connected to VH which is for example 5 volts. Then it can be seen that when 3.3 volts are applied to input 30, there will be 3.3 volts at the gate of transistor 22 and zero at the input to the gate of transistor 20. Once again transistor 20 is off and transistor 22 will be on or conducting but now the ground at node 34 reflected at the gate of transistor 16 turns on transistor 16 and causes 5 volts to appears at node 36. There is now 5 volts across transistor 20 which far exceeds its maximum recommended voltage of 3.63 volts. The 5 volts at node 36 is also reflected at the gate of transistor 18. Transistor 18 now has 5 volts on its drain, 5 volts on its gate, and ground on its source and it, too, is in danger for the voltage across one of its junctions far exceeds the maximum recommended voltage of 3.63 volts. The conventional approach does not work. Conventional voltage limiter 42 might serve again to protect transistors 20 and 22.

Figure 3:
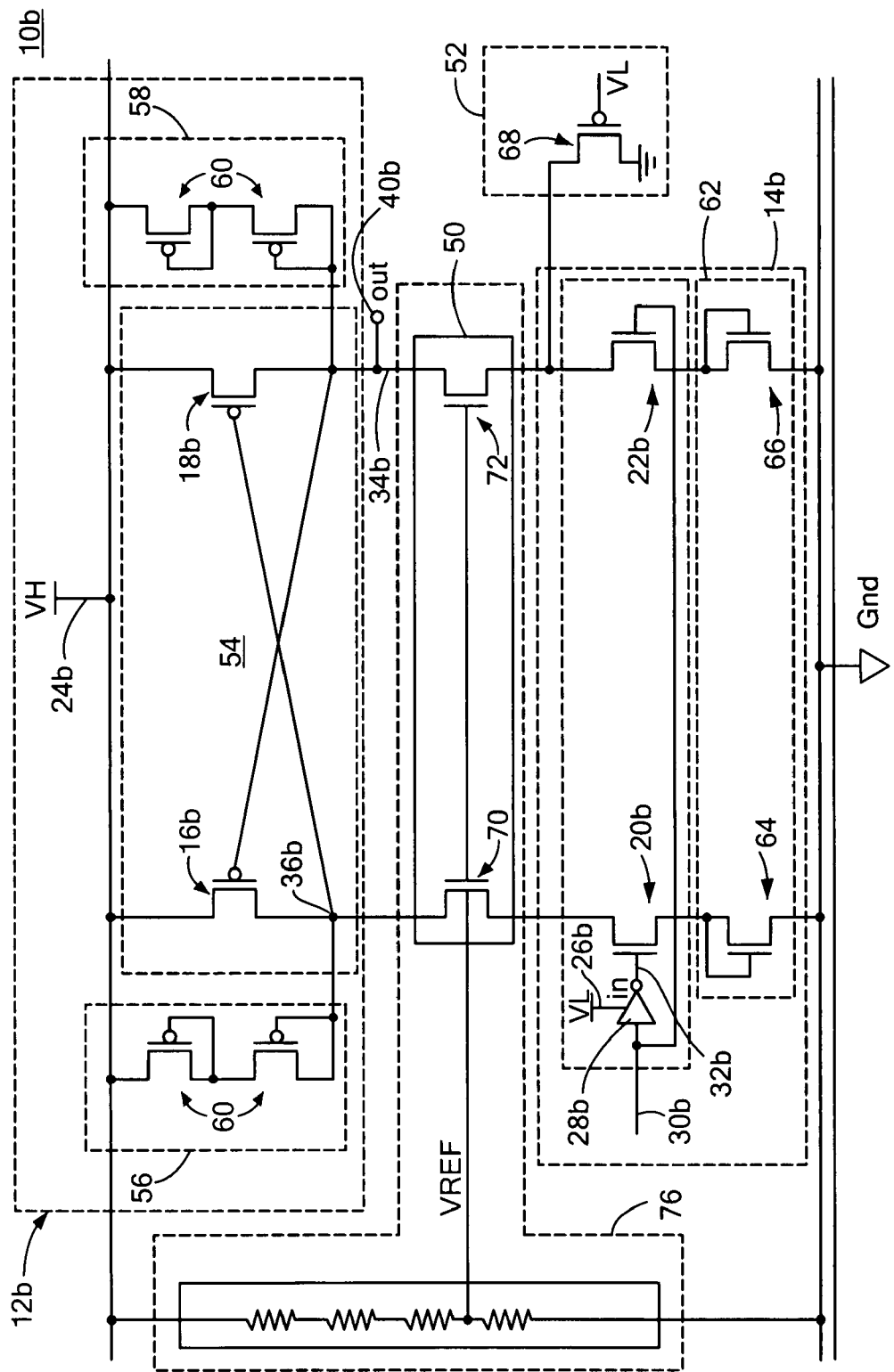
FIG. 3 is a schematic diagram of a multistage dual logic level voltage translator according to this invention.

The multistage dual logic level voltage translator 10b, FIG. 3, of this invention includes output stage 12b, input stage 14b, voltage limiter circuit 50, and power supply absence detector 52. Output stage 12b includes high voltage converter 54 including cross-coupled PMOS transistors 16b and 18b. The voltages VL and VH are the same as in FIG. 2, namely VL equals 3.3 volts VH equals 5.0 volts. A 3.3 volt input at 30b will, as previously shown with respect to FIG. 2, end up with excessive voltage on transistor 18b. But, in accordance with this invention, output stage 12b also includes a pair of clamping circuits 56, 58. Each of which in this case includes one or more PMOS transistors 60 which are disposed across transistor 18b in the case of clamping circuit 58 and transistor 16b in the case of clamping circuit 56. Assuming that the voltage drop across each of the two diode connected PMOS transistors 60 is approximately one volt, it can be seen that clamping circuit 58 drops the five volts by two volts to three volts. So that instead of ground at node 34b, the voltage there is actually three volts. A diode connected PMOS is a PMOS transistor where the gate is coupled to the drain. The voltage drop across a diode connected device is the voltage difference between the source and the drain of the diode connected device. With three volts at node 34b and five volts on the other side of transistor 18b the voltage across it is only two volts and so it is safely below the maximum recommended voltage. With an input of zero volts instead of 3.3 volts at input 30b the same protection is afforded to transistor 16b by clamping circuit 56. Thus with zero volts at input 32b the output at output 40b is three volts: the zero or low level has been shifted up to three volts in contrast to the prior art which kept it at zero without shifting. With zero volts at input 30b and 3.3 volts at input 32b the converse conditions occur: transistor 18b conducts and there is the full VH or five volts at output 40b, so that 3.3 volt input has been shifted to five volts. Thus, voltage shifter 10b of this invention can safely operate with an upper voltage VH equal to five volts which exceeds the maximum recommended voltage of the high voltage transistors TH used, 3.63 volts. It can also be seen that the invention is capable of shifting both input logic levels. If the input level equals VL (3.3 volts), then the output equals VH (5 volts). And if the input equals zero the output, unlike the prior art, is not equal to zero but is equal to VX where 0<VX<VH and where VX is further equal to VH−Vclamp where Vclamp is the voltage across the clamping circuit, in this case across the two diode connected PMOS transistors 60. Thus adding the clamping circuits forces the output to be higher than zero volts but lower than VH. The clamps can be designed to provide the required voltage drop from VH to protect the transistors. However, VX has to be low enough to effectively control the switching of $TH_s$, while remaining high enough to avoid exposing any transistors to voltages higher than there maximum recommended voltage. In this particular embodiment PMOS diode-connected transistors 60 are cascode connected. It should be understood that the clamp circuit could be implemented using other devices, e.g. diodes, bi-polar junction transistors, resistive elements, and the number of devices is not limited to two.

The addition of clamping circuits 56 and 58 introduces some additional current flow and consumption of power in the circuit. However, this can be reduced by adding a current limiting circuit 62 which includes in this embodiment an NMOS diode-connected transistor 64, 66 in series with each of the input stage transistors 20b and 22b. The diode junction drop across each of these transistors 64 and 66, raises the source of each of transistors 20b and 22b so that source is closer to the voltage of the gate thereby decreasing the conduction and reducing the current required. Limiting transistors 64 and 66 operate as degenerative devices and although they are shown as diode-connected NMOS devices, they could be implemented with other devices, e.g. diodes, bipolar junction transistors, resistors, or other impedances.

Another feature of this invention is the power supply absence detector circuit 52 which may include a PMOS transistor 68 which is turned on to conduct whenever the lower voltage supply VL is absent. When that is detected transistor 68 conducts causing the voltage drop across clamping circuit 58, in this case, two volts, to be subtracted from the high voltage, VH, five volts, to produce at node 34b a voltage of three volts. When VL is powered up to 3.3 volts, for example, detector 52 does not affect the operation of the circuit, but when VL is powered down toward zero volts while VH is up at five volts, for example, detector 52 will turn on causing current to flow through voltage clamp 58 pulling down the output voltage to VH−clamp, in this particular embodiment 5 volts−2 volts=3 volts. This output value is low enough to guarantee that transistor 16b will pull up node 36b to VH thus giving the voltage shifter deterministic output value of three volts during power supply sequencing, regardless of the value of in and inb. This will guarantee that no device is a exposed to a voltage exceeding its maximum recommended voltage during power supply sequencing. While detector 52 is shown implemented with a PMOS transistor any device acting like a voltage controlled switch or a voltage controlled current source could be used.

Also included in shifter 10b is voltage limiter 50. It uses a pair of native NMOS transistors 70, 72 the operative feature of which is that they are in a conducting state when the voltage across their gate and source is zero. Also included in voltage limiter 50 is a bias voltage generator or network 76, which may for example be a resistor network as shown. With a VH of 5 volts at terminal, 24b a 2.8 volt bias is applied to the gates of native transistors 70 and 72, thus they conduct with little voltage loss to the system. When node 36b is at five volts, transistor 70 would be in danger because of the low, ground, condition of the lower source terminal of transistor 70. But since transistor 16b is off, no current is flowing. This forces the source terminal of transistor 70 to rise above 2.8 volts, for example, 3.2 volts and therefore reduces the voltage across N1 to 3.2 volts, well below the maximum recommended voltage. At the same time transistor 72 source terminal will be at 2.8 volts when it conducts, matching the bias and so transistor 72, too, is safe along with transistor 22b. If VH at terminal 24b is reduced from 5.0 volts, the bias network 76 scales down the bias voltage from 2.8 volts to a voltage proportionally lower and the circuit continues to function even down to where VH equals VL.

In contrast with the prior art, in voltage translator 10b, FIG. 3, TH transistors were used throughout the circuit. Further in the conventional voltage limiters referred to in FIGS. 1 and 2 the circuit was formed by two typically high voltage transistors, but here voltage limiter 50 is formed using high voltage native NMOS devices. In additional to offering all the required voltage protection, native transistors maintain the drains of transistors 20b, and 22b at a higher voltage allowing the system to be functional even when VH equals VL. Although bias voltage generator 76 is shown as a resistor network other devices, for example, diodes could be used to generate the voltage. Throughout the circuits, CMOS transistors, namely, PMOS and NMOS were used but any other devices with similar characteristics could be used, e.g. bi-polar junction transistors, JFET transistors.

Figure 4:
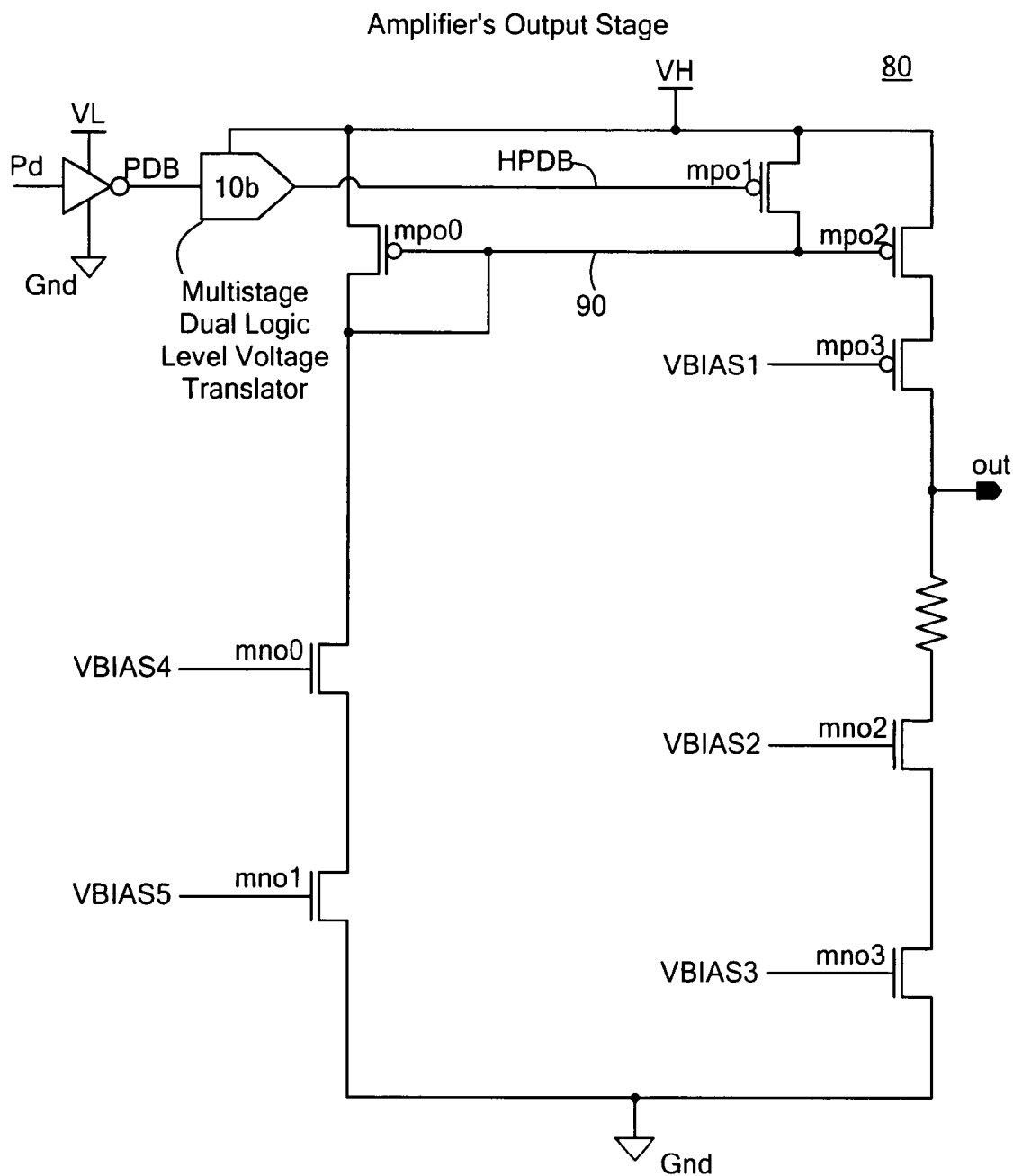
FIG. 4 is a schematic diagram of the output stage of an amplifier employing the multistage dual logic level voltage translator of this invention.

An example of an application of the dual logic level voltage translator of this invention is shown in FIG. 4, which represents the output stage of an amplifier 80 powered by VH, where VH exceeds the maximum recommended voltage of the high voltage transistors TH. Different techniques can be used to protect the transistors forming the amplifier from exceeding the maximum allowed voltage, but to control a power down device of the output stage the proposed invention would be beneficial.

When the amplifier 80 is being used HPDB will be equal to VH. When the amplifier is being powered down, HPDB on the other hand, will be equal to VX which is equal VH−Vclamp which thereby keeps the voltages between all MPO1 terminals below the maximum recommended voltage, while turning on MPO1 and thus pulling node 90 to VH and effectively powering down the amplifier. MPO1 will be protected if VH is high while VL is low during a power up or power down and it will guarantee the output stage of the amplifier will be powered down. Finally if VH is lowered to operate the amplifier at a lower voltage, the voltage shifter of this invention will scale accordingly maintaining system functionality.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

The invention claimed is:

1. A multistage dual logic level voltage translator for translating both high and low input logic levels to higher levels, wherein at least one of the higher levels is above the maximum recommended voltage for transistors implementing the stages, comprising:
   an input stage for receiving input logic levels comprising a low voltage, VL, power supply terminal;
   an output stage comprising a high voltage, VH, power supply terminal, and a high voltage converter having at least a pair of cross-coupled converter transistors responsive to the input stage and comprising a pair of clamping circuits connected one across each of the converter transistors, for providing the shifted low and high output logic levels; and
   a low voltage power supply absence detector circuit for sensing an absence of input logic levels and enabling a determinate output voltage, the high voltage VH minus the clamp voltage.

2. The multistage dual logic level voltage translator of claim 1, wherein the converter transistors are PMOS transistors.

3. The multistage dual logic level voltage translator of claim 2, wherein the clamping circuits each include at least one diode connected PMOS transistor.

4. The multistage dual logic level voltage translator of claim 1, wherein the input stage comprises a pair of input transistors.

5. The multistage dual logic level voltage translator of claim 4, wherein the input transistors are NMOS transistors.

6. The multistage dual logic level voltage translator of claim 5, wherein the input stage comprises a current limiting circuit in series with each input transistor for limiting the current from the clamping circuits.

7. The multistage dual logic level voltage translator of claim 1, further comprising a voltage limiter circuit interconnecting the input and output stages for protecting the input stage from voltages in excess of the maximum recommended voltage.

8. The multistage dual logic level voltage translator of claim 7, wherein the voltage limiter circuit comprises a pair of native NMOS transistors.

9. The multistage dual logic level voltage translator of claim 8, wherein the output stage has a high voltage, VH, power supply terminal and the input stage has a low voltage, VL, power supply terminal.

10. The multistage dual logic level voltage translator of claim 9, wherein the voltage limiter circuit comprises a bias network responsive to the high voltage, VH, power supply terminal for varying the bias on the native NMOS transistors.

11. The multistage dual logic level voltage translator of claim 1, wherein the input stage comprises an inverter for generating a differential signal from the input logic levels and the low voltage, VL power supply terminal is on the inverter.

12. A multistage dual logic level voltage translator for translating both high and low input logic levels to higher levels, wherein at least one of the higher levels is above the maximum recommended voltage for transistors implementing the stages, comprising:
   an input stage for receiving input logic levels and comprising a pair of input NMOS transistors and a current limiting circuit in series with each said input transistor, the current limiting circuit comprising a diode connected NMOS transistor; and
   an output stage comprising a high voltage converter having at least a pair of cross-coupled converter transistors responsive to said input stage and comprising a pair of clamping circuits connected one across each of said converter transistors, for providing the shifted low and high output logic levels.

13. The multistage dual logic level voltage translator of claim 12, wherein the output stage has a high voltage, VH, power supply terminal and the input stage has a low voltage, VL, power supply terminal.

14. The multistage dual logic level voltage translator of claim 13, further comprising a low voltage power supply absence detector circuit for sensing an absence of input logic levels and enabling a determinate output voltage, the high voltage VH minus the clamp voltage.

15. The multistage dual logic level voltage translator of claim 13, wherein the input stage comprises an inverter for generating a differential signal from the input logic levels and the low voltage, VL power supply terminal is on the inverter.

16. The multistage dual logic level voltage translator of claim 12, wherein the converter transistors are PMOS transistors.

17. The multistage dual logic level voltage translator of claim 16, wherein the clamping circuits each comprises at least one diode connected PMOS transistor.

18. The multistage dual logic level voltage translator of claim 12, further comprising a voltage limiter circuit interconnecting the input and output stages for protecting the input stage from voltages in excess of the maximum recommended voltage.

19. The multistage dual logic level voltage translator of claim 18, wherein the voltage limiter circuit comprises a pair of native NMOS transistors.

20. The multistage dual logic level voltage translator of claim 19, wherein the output stage has a high voltage, VH, power supply terminal and the input stage has a low voltage, VL, power supply terminal.

21. The multistage dual logic level voltage translator of claim 20, wherein the voltage limiter circuit includes a bias network responsive to the high voltage, VH, power supply terminal for varying the bias on the native NMOS transistors.

22. A multistage dual logic level voltage translator translating both high and low input logic levels to higher levels, wherein at least one of the higher levels is above the maximum recommended voltage for transistors implementing the stages, comprising:
   an input stage for receiving input logic levels;
   an output stage comprising a high voltage converter having at least a pair of cross-coupled converter transistors responsive to the input stage and comprising a pair of clamping circuits connected one across each of the converter transistors configured to provide the shifted low and high output logic levels to an output of the voltage translator; and
   a voltage limiter circuit interconnecting the input and output stages for protecting the input stage from voltages in excess of the maximum recommended voltage,
   wherein the voltage limiter circuit comprises a pair of native NMOS transistors.

23. The multistage dual logic level voltage translator of claim 22, wherein the output stage has a high voltage, VH, power supply terminal and the input stage has a low voltage, VL, power supply terminal.

24. The multistage dual logic level voltage translator of claim 23, wherein the voltage limiter circuit comprises a bias network responsive to the high voltage, VH, power supply terminal for varying the bias on the native NMOS transistors.

25. The multistage dual logic level voltage translator of claim 24, wherein the bias network comprises a plurality of resistors.

26. The multistage dual logic level voltage translator of claim 24, wherein the bias network is connected to the high voltage, VH, power supply terminal.

27. The multistage dual logic level voltage translator of claim 22, wherein all of the transistors of both the input and output stages are high-voltage transistors.

* * * * *